United States Patent [19]
Kendall

[11] Patent Number: 6,053,241
[45] Date of Patent: Apr. 25, 2000

[54] COOLING METHOD AND APPARATUS FOR CHARGED PARTICLE LENSES AND DEFLECTORS

[75] Inventor: Rodney Arthur Kendall, Ridgefield, Conn.

[73] Assignee: Nikon Corporation, Tokyo, Japan

[21] Appl. No.: 09/156,007

[22] Filed: Sep. 17, 1998

[51] Int. Cl.[7] .................................................. F28D 15/00
[52] U.S. Cl. .................................... 165/104.33; 165/80.4; 250/396 ML
[58] Field of Search ................................ 165/80.2, 80.4, 165/80.5, 104.33; 250/396 ML, 492.2

[56] References Cited

U.S. PATENT DOCUMENTS

| | | | |
|---|---|---|---|
| 3,524,497 | 8/1970 | Chu et al. ................................ | 165/80.4 |
| 4,168,434 | 9/1979 | Lischke et al. .................. | 250/396 ML |
| 4,214,162 | 7/1980 | Hoppe et al. ..................... | 250/396 ML |
| 4,226,281 | 10/1980 | Chu ........................................ | 165/80.4 |
| 4,649,990 | 3/1987 | Kurihara et al. ........................ | 165/80.4 |
| 4,823,863 | 4/1989 | Nakajima et al. ...................... | 165/80.4 |
| 4,977,324 | 12/1990 | Kruit et al. ....................... | 250/396 ML |
| 5,012,104 | 4/1991 | Young .............................. | 250/396 ML |
| 5,131,233 | 7/1992 | Cray et al. .................................. | 62/64 |
| 5,136,166 | 8/1992 | Young .............................. | 250/396 ML |
| 5,228,502 | 7/1993 | Chu et al. .............................. | 165/80.4 |
| 5,264,706 | 11/1993 | Ose et al. ............................. | 250/492.2 |
| 5,289,009 | 2/1994 | Bakker et al. .................... | 250/396 ML |
| 5,316,075 | 5/1994 | Quon et al. ............................. | 165/80.4 |
| 5,338,939 | 8/1994 | Nishino et al. .................. | 250/396 ML |
| 5,382,800 | 1/1995 | Nishino et al. .................. | 250/396 ML |
| 5,563,415 | 10/1996 | Crewe .............................. | 250/396 ML |
| 5,629,526 | 5/1997 | Nakasuji ..................................... | 250/396 |
| 5,631,615 | 5/1997 | Messick et al. ........................ | 335/210 |
| 5,926,945 | 7/1999 | Messick et al. ............................ | 29/605 |

*Primary Examiner*—Ira S. Lazarus
*Assistant Examiner*—Terrell McKinnon
*Attorney, Agent, or Firm*—Graham S. Jones, II

[57] ABSTRACT

A method of cooling a deflection system for a particle beam, containing vibration sensitive deflection devices comprises providing a vibrating cooled heat exchange structure spaced away from the vibration sensitive deflection devices. The technique used is transmission of the heat away from the vibration sensitive devices to the heat exchange structure through a high thermal conductivity structure such as a cold plate. The heat is transmitted from a static heat exchange structure with a static, inert fluid through cold plates to a vibrating heat exchanger cooled by turbulent liquid passing through a cooling coil in the heat exchanger.

20 Claims, 2 Drawing Sheets

COOLING METHOD AND APPARATUS FOR CHARGED PARTICLE LENSES AND DEFLECTORS

BACKGROUND OF THE INVENTION

1. Field of the Invention

This invention relates to high energy beam systems and more particularly to cooling of the elements of such systems.

2. Description of Related Art

In charged particle systems used for microlithography it is essential that the lenses and deflectors employed in the system are mechanically stable during operation, i.e. remain in relatively fixed positions, since vibration and movement of the lenses and the deflectors will result in errors in positioning of the beam being deflected by the system. One source of mechanical instability is thermal expansion. Another source of mechanical instability is vibration, which is a particular problem with deflectors.

SUMMARY OF THE INVENTION

In accordance with this invention, a method of cooling a deflection system for a particle beam with deflection devices comprises providing a cooled heat exchange structure spaced away from the deflection devices. Heat is transmitted away from the devices to the heat exchange structure through a high thermal conductivity structure.

Preferably, the heat exchange structure is located adjacent to the devices and the high thermal conductivity structure comprises conductive elements reaching into a static coolant in a static heat exchange structure; and cooling plates reach from the heat exchange structure to a static coolant in a static heat exchange structure.

Preferably, the heat exchange structure is located adjacent to the devices and the high thermal conductivity structure comprises conductive cooling plate elements reach from the heat exchange structure into a static coolant in a static heat exchange structure.

A first coolant is employed to cool the heat exchange structure and a second coolant is employed to cool the deflection devices by transferring heat from the second coolant to the first coolant through an intermediate stage.

In accordance with another aspect of this invention, a deflection system for a particle beam, a method of cooling deflection devices comprises a cooled heat exchange structure spaced away from the deflection devices. High thermal conductivity means transmit heat away from the devices to the heat exchange structure connected between the heat exchanger and the deflection devices.

The heat exchange structure is located adjacent to the devices and the high thermal conductivity structure comprises conductive elements reaching into a static coolant in a static heat exchange structure; and cooling plates reach from the heat exchange structure to a static coolant in a static heat exchange structure.

Preferably, the heat exchange structure is located adjacent to the devices and the high thermal conductivity structure comprises conductive cooling plate elements reach from the heat exchange structure into a static coolant in a static heat exchange structure.

Preferably, a first coolant is employed to cool the heat exchange structure and a second coolant is employed to cool the deflection devices by transferring heat from the second coolant to the first coolant through an intermediate stage.

The present invention provides the following advantages:

(1) Lithography performance is improved by reduction in errors caused by vibration and movement of the lenses and deflectors caused by cooling system problems.

(2) Reduced operating costs are achieved due to reduced coolant (fluorinert) consumption.

(3) There is no penalty for increased coolant flow rates.

BRIEF DESCRIPTION OF THE DRAWINGS

The foregoing and other aspects and advantages of this invention are explained and described below with reference to the accompanying drawings, in which.

PROBLEM

Figure 1:
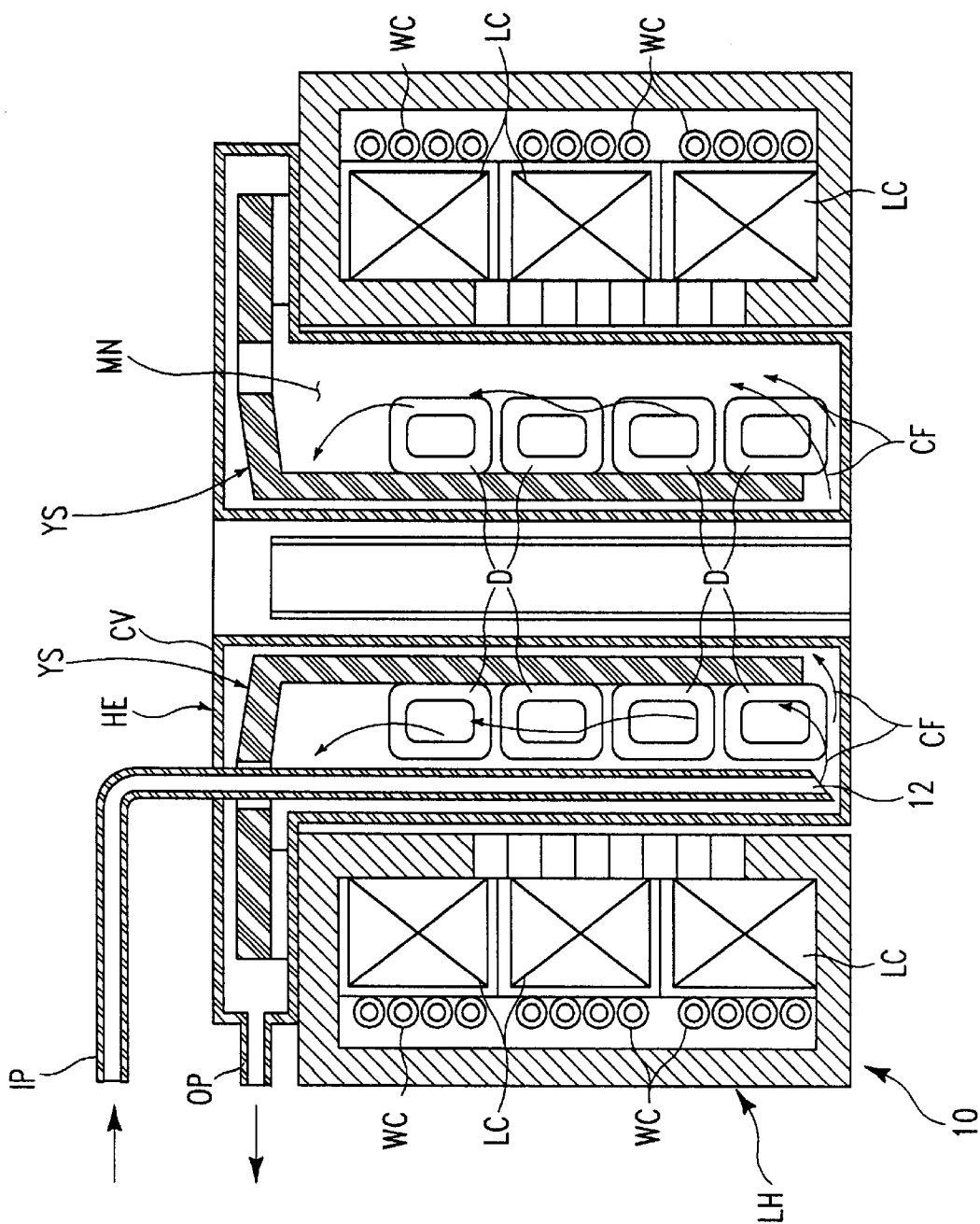
FIG. 1 is a cross-section view of a portion of a lens/deflector subsystem of a charge particle system which includes a lens housing which manifests problems solved by the present invention.

FIG. 1 is a cross-section of a portion of a lens/deflector subsystem 10 of a charge particle system which includes a lens housing LH. Lens coils LC are shown inside housing LH with water cooled coils WC wrapped around the lens coils LC. The water cooled coils WC do not cause any vibration problems. Deflectors D, which are located between the lens coils LC, are cooled by an inert liquid CF which is supplied to the input line IP and which passes from outlet 12 into manifold MN.

The manifold MN provides a high velocity flow of an inert liquid to avoid thermal expansion and vibration of the deflectors D shown between the lens coils LC, it is possible to immerse the deflectors D in a circulating flow CF of a temperature controlled inert liquid through inlet pipe IP and manifold MN, among other pathways inside the coolant vessel CV which surrounds the deflectors D.

A yoke support YS is shown inside the coolant vessel CV. The coolant leaves the coolant vessel CV through the outlet pipe OP. The problem with this approach is that the liquid flow through the manifold MN creates turbulence which causes mechanical vibration, which in turn causes mechanical vibration of the deflectors D, leading to a degradation of lithographic performance.

I have found that the inert fluid surrounding the deflectors D is required, since it is in direct contact with the deflectors D because of heat exchange requirements and since I have found that it is harmful to allow direct contact of deflectors D with a coolant such as water will cause corrosion of the deflectors D.

DESCRIPTION OF THE PREFERRED EMBODIMENT

Figure 2:
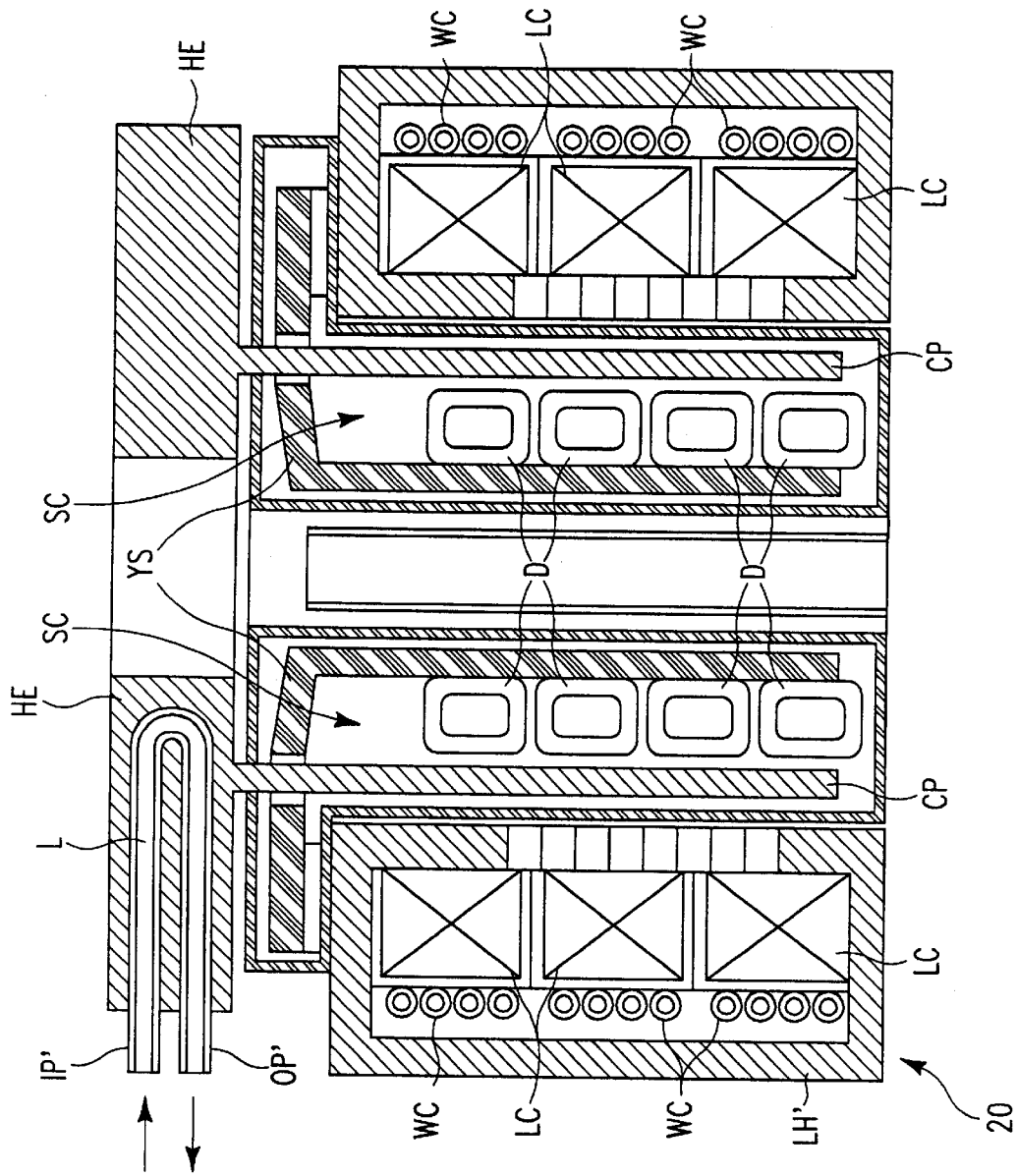
FIG. 2 shows a cross-sectional view of a lens/deflector subsystem of a charge particle system in accordance with this invention which includes a lens housing which is modified by the replacement of the coolant vessel of FIG. 1 with a heat exchange structure and cold plates which are integral with the subsystem.

FIG. 2 shows a cross-sectional view of a lens/deflector subsystem 20 of a charge particle system in accordance with this invention which includes a lens housing LH' which is modified by the replacement of the coolant vessel of FIG. 1 with a heat exchange structure HE and cold plates CP which are integral with the subsystem 20. Like parts have like functions and the same indicia are employed to designate those parts and functions. Lens coils LC are shown inside housing LH'. To avoid the flow turbulence this invention employs a static coolant approach by placing the deflectors D in a still bath SC of an inert liquid (e.g. fluorinated perfluoro compounds sold as Fluorinert Brand Electronic Liquids by 3M Corp. St. Paul Minn.) allowing cooling of deflectors D by convection without any vibration.

To maintain the inert liquid (e.g. Fluorinert) at a fixed temperature, and thereby to maintain the deflectors D at a fixed temperature, a liquid-to-liquid heat exchanger HE is installed on the exterior of the lens housing LH'. Inlet pipe IP and outlet pipe OP connect to a short line L which loops back through the structure of the heat exchanger HE. Cold plates CP which are attached to the heat exchanger HE extend into the housing LH' into contact with the still bath SC. The coolant for the heat exchanger HE is water, since the heat exchange HE is not subject to corrosion from water as are the deflectors D.

Because the heat exchanger HE is mechanically isolated from the deflectors D themselves, vibrations caused by the high velocity of water flowing through the heat exchanger HE from inlet pipe IP to outlet pipe OP are not transmitted to the deflectors D. Yet the cooling plate CP conducts heat away efficiently from the deflectors D. In this way the benefits of an active liquid cooling system can still be employed without the penalty of flow induced vibrations affecting the deflectors D.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method comprising the steps of as follows:
   providing cooling of a deflection system for a particle beam with said system including deflection devices (D) contained in a lens housing (LH') by surrounding said deflection devices (D) in said lens housing (20) with a static vibration free coolant (SC),
   providing said lens housing (LH') on the exterior thereof with an exterior cooled heat exchange structure (HE) having high thermal conductivity through which fluid coolant circulates at high velocity, said exterior heat exchange structure (HE) being spaced away from said deflection devices (D) of said deflection system,
   providing a high thermal conductivity structure (CP) located within said static vibration free coolant (SC) and attached to said exterior heat exchange structure (HE), and
   transmitting heat away from said deflection devices (D) by convection of heat through said static vibration free coolant (SC) to said high thermal conductivity structure (CP) and said heat passing from said coolant (SC) to said heat exchange structure (HE) through said high thermal conductivity structure (CP).

2. A method of cooling in accordance with claim 1 wherein:
   said exterior heat exchange structure (HE) is located outside said lens housing (LH') spaced away from said deflection devices D beyond a yoke structure (YS),
   locating a static heat exchange structure (LH') adjacent to said deflection devices D,
   said high thermal conductivity structure (CP) comprises conductive elements reaching into said static coolant (SC) in said static heat exchange structure (LH').

3. A method of cooling in accordance with claim 1 wherein:
   cooling plates reach from said exterior heat exchange structure (HE) into a static coolant (SC) in a static heat exchange structure (LH').

4. A method of cooling in accordance with claim 1 wherein:
   a static heat exchange structure (LH') is located adjacent to said deflection devices (D) and said high thermal conductivity structure (CP) comprises conductive cooling plate elements reaching from said exterior heat exchange structure (HE) into said static coolant in said static heat exchange structure (LH').

5. A method of cooling in accordance with claim 1 wherein:
   a first coolant comprising water is employed to cool said exterior heat exchange structure (HE) and
   said static coolant (SC) comprising an inert liquid is employed to cool said deflection devices by transferring heat from said (SC) coolant to said first coolant through an intermediate stage (CP).

6. A method of cooling in accordance with claim 2 wherein:
   a first coolant (SC) is employed to cool said exterior heat exchange structure (HE) and
   a second coolant is employed to cool said deflection devices by transferring heat from said second coolant comprising an inert liquid to said first coolant comprising water through an intermediate stage.

7. A method of cooling in accordance with claim 3 wherein:
   a first coolant comprising water is employed to cool said exterior heat exchange structure and said static coolant (SC) is employed to cool said deflection devices (D) by transferring heat from said static coolant (SC) to said first coolant through an intermediate stage (CP).

8. A method of cooling in accordance with claim 4 wherein:
   a first coolant is employed to cool said heat exchange structure and a second coolant is employed to cool said deflection devices by transferring heat from said second coolant to said first coolant through an intermediate stage.

9. A deflection system for a particle beam comprising:
   deflection devices for a particle beam, said deflection devices being contained in a lens housing (LH'),
   means for cooling said deflection devices (D) in said lens housing by surrounding said deflection devices in said lens housing with a static vibration free coolant (SC),
   said means for cooling comprising an exterior, cooled heat exchange structure (HE) having high thermal conductivity through which fluid coolant circulates at high velocity, said exterior heat exchange structure being spaced away from said deflection devices,
   means for transmitting heat away from said deflection devices (D) by convection of heat through said static vibration free coolant (SC), and
   a high thermal conductivity structure located within said static, vibration free coolant for transmitting heat away from said devices to said exterior heat exchange structure (HE), said high thermal conductivity means (CP) being attached to said exterior heat exchange structure (HE).

10. A system in accordance with claim 9 wherein:
    said static heat exchange structure (LH') is located adjacent to said devices (D) and said high thermal conductivity structure (CP) comprises conductive elements reaching into said static coolant (SC) in said static heat exchange structure (LH').

11. A system in accordance with claim 9 wherein:

cooling plates reach from said exterior heat exchange structure to said static coolant in said static heat exchange structure.

12. A system in accordance with claim 9 wherein:

said static heat exchange structure is located adjacent to said deflection devices and said high thermal conductivity structure comprises conductive cooling plate elements reaching from said exterior heat exchange structure into said static coolant in said static heat exchange structure.

13. A system in accordance with claim 9 wherein:

a first coolant comprising water is employed to cool said heat exchange structure and a second coolant comprising an inert liquid is employed to cool said deflection devices by transferring heat from said second coolant to said first coolant through an intermediate stage.

14. A system in accordance with claim 10 wherein:

a first coolant is employed to cool said exterior heat exchange structure and a second coolant is employed to cool said deflection devices by transferring heat from said second coolant comprising an inert liquid to said first coolant comprising water through an intermediate stage.

15. A system in accordance with claim 11 wherein:

a first coolant comprising water is employed to cool said heat exchange structure and a second coolant comprising an inert liquid is employed to cool said deflection devices by transferring heat from said second coolant to said first coolant through an intermediate stage.

16. A system in accordance with claim 12 wherein:

a first coolant comprising water is employed to cool said heat exchange structure and a second coolant comprising an inert liquid is employed to cool said deflection devices by transferring heat from said second coolant to said first coolant through an intermediate stage.

17. A deflection system for a particle beam with cooling deflection devices comprising:

deflection devices for a particle beam, said deflection devices being contained in a lens housing (LH') in a static convection coolant, a cooled exterior heat exchange structure spaced away from said deflection devices a sufficient distance to minimize transmission of vibration from an exterior coolant circulating at high velocity, and high thermal conductivity means for transmitting heat away from said devices to said heat exchange structure attached to said heat exchanger and juxtaposed with said deflection devices in said static convection coolant.

18. A system in accordance with claim 17 wherein:

said heat exchange structure is located away from said devices and said high thermal conductivity structure comprises conductive elements reaching into a static coolant in a static heat exchange structure.

19. A system in accordance with claim 17 wherein:

cooling plates reach from said heat exchange structure to a static coolant in a static heat exchange structure.

20. A system in accordance with claim 17 wherein:

said high thermal conductivity structure is located adjacent to said devices and said high thermal conductivity structure comprises conductive cooling plate elements which reach from said heat exchange structure into a static coolant in a static heat exchange structure, and a first coolant is employed to cool said heat exchange structure and a second coolant is employed to cool said deflection devices by transferring heat from said second coolant to said first coolant through an intermediate stage.

* * * * *